(12) United States Patent
Mori et al.

(10) Patent No.: US 8,642,943 B2
(45) Date of Patent: Feb. 4, 2014

(54) SEMICONDUCTOR WAFER, LIGHT-RECEIVING ELEMENT, LIGHT-RECEIVING ELEMENT ARRAY, HYBRID-TYPE DETECTION DEVICE, OPTICAL SENSOR DEVICE, AND PROCESS FOR PRODUCTION OF SEMICONDUCTOR WAFER

(75) Inventors: Hiroki Mori, Osaka (JP); Yasuhiro Iguchi, Osaka (JP); Hiroshi Inada, Osaka (JP); Youichi Nagai, Osaka (JP); Kouhei Miura, Osaka (JP); Hideaki Nakahata, Itami (JP); Katsushi Akita, Itami (JP); Takashi Ishizuka, Itami (JP); Kei Fujii, Itami (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 13/640,922

(22) PCT Filed: Dec. 3, 2010

(86) PCT No.: PCT/JP2010/071649
§ 371 (c)(1),
(2), (4) Date: Oct. 12, 2012

(87) PCT Pub. No.: WO2011/129031
PCT Pub. Date: Oct. 20, 2011

(65) Prior Publication Data
US 2013/0048838 A1    Feb. 28, 2013

(30) Foreign Application Priority Data

Apr. 13, 2010 (JP) .................. 2010-092523

(51) Int. Cl.
H01L 31/101    (2006.01)
H01L 31/18     (2006.01)
H01L 33/06     (2010.01)

(52) U.S. Cl.
USPC ...... 250/214.1; 257/13; 257/21; 257/E33.008; 257/E31.054; 438/73

(58) Field of Classification Search
USPC ............. 257/13, 21, E31.054, E33.008; 250/214.1; 438/73
See application file for complete search history.

(56) References Cited

FOREIGN PATENT DOCUMENTS

JP    05-160429    6/1993
JP    2009-272385  11/2009

(Continued)

OTHER PUBLICATIONS

Takahashi et al., "InGaAs Photodetector for Near Infrared," Optronics, No. 3, pp. 107-113 (1997).

(Continued)

Primary Examiner — Whitney T Moore
(74) Attorney, Agent, or Firm — Venable LLP; Michael A. Sartori

(57) ABSTRACT

A light-receiving element includes an InP substrate 1, a light-receiving layer 3 having an MQW and located on the InP substrate 1, a contact layer 5 located on the light-receiving layer 3, a p-type region 6 extending from a surface of the contact layer 5 to the light-receiving layer, and a p-side electrode 11 that forms an ohmic contact with the p-type region. The light-receiving element is characterized in that the MQW has a laminated structure including pairs of an $In_xGa_{1-x}As$ ($0.38 \leq x \leq 0.68$) layer and a $GaAs_{1-y}Sb_y$ ($0.25 \leq y \leq 0.73$) layer, and in the $GaAs_{1-y}Sb_y$ layer, the Sb content y in a portion on the InP substrate side is larger than the Sb content y in a portion on the opposite side.

16 Claims, 10 Drawing Sheets

(56) References Cited

FOREIGN PATENT DOCUMENTS

| WO | WO-2009/101740 | 8/2009 |
| WO | WO-2010/032553 A1 | 3/2010 |

OTHER PUBLICATIONS

Sidhu et al., "A 2.3μm Cutoff Wavelength Photodiode on InP Using Lattice-Matched GaInAs—GaAsSb Type-II Quantum Wells," 2005 International Conference on Indium Phosphide and Related Materials, pp. 148-151 (2005).

NUMBER OF ELEMENTS: 320 x 256
PITCH: 30 μm PITCH
SIZE: 10 mm IN WIDTH x 9 mm IN LENGTH

SEMICONDUCTOR WAFER, LIGHT-RECEIVING ELEMENT, LIGHT-RECEIVING ELEMENT ARRAY, HYBRID-TYPE DETECTION DEVICE, OPTICAL SENSOR DEVICE, AND PROCESS FOR PRODUCTION OF SEMICONDUCTOR WAFER

TECHNICAL FIELD

The present invention relates to a semiconductor wafer, a light-receiving element, a light-receiving element array, a hybrid-type detection device, an optical sensor device, and a process for production of a semiconductor wafer, all of which target light reception in the near-infrared region.

BACKGROUND ART

The near-infrared region corresponds to an absorption spectrum range related to biological objects such as plants and animals, and the environment. Therefore, the development of a detector of near-infrared light, the detector including a light-receiving layer composed of a group III-V compound semiconductor corresponding to the near-infrared light has been actively conducted. For example, NPL 1 discloses an example of a detector that converts photo-induced charge into an output signal, the detector including a light-receiving element array in which the sensitivity is extended to a wavelength of 2.6 μm by using extended-InGaAs as a light-receiving layer and a complementary metal-oxide semiconductor (CMOS) which is a read-out circuit (ROIC: read-out IC) and is connected to the light-receiving element array. In the light-receiving element array, electrons of electron-hole pairs generated by incident light are collected in a common n-side electrode, and holes of the electron-hole pairs are read out from a p-side electrode, which is a pixel electrode, to the CMOS.

In addition, NPL 2 has reported that a pin-type photodiode including a light-receiving layer having a type-II multiquantum well structure (MQW) composed of InGaAs/GaAsSb and a p-type pixel region has a sensitivity up to a wavelength of 2.5 μm.

CITATION LIST

Non Patent Literature

NPL 1: Hideo Takahashi, et al., "InGaAs photodetector for near infrared", OPTRONICS (1997), No. 3, pp. 107-113

NPL 2: R. Sidhu, N. Duan, J. C. Campbell, and A. L. Holmes, Jr., "A 2.3 μm cutoff wavelength photodiode on InP using lattice-matched GaInAs—GaAsSb type II quantum wells" 2005 International Conference on Indium Phosphide and Related Materials

DISCLOSURE OF INVENTION

Technical Problem

The InGaAs photodetector (image sensor) for near infrared described in NPL 1 includes a light-receiving layer composed of InGaAs having a composition which is not lattice-matched with an InP substrate. Therefore, the dark current of the photodetector is increased by the lattice mismatch, thereby increasing noise. Although, for example, distortion due to the lattice mismatch is gradually absorbed by providing a buffer layer, the effect of absorbing the distortion due to the lattice mismatch is limited. In order to reduce this noise and to improve the S/N ratio to a level for practical use, a cooling device is necessary, and thus the size of the photodetector is increased. In addition, InP or the like cannot be used as a window layer that is epitaxially grown on an InGaAs light-receiving layer because of the lattice mismatch. For example, when InAsP (where a ratio As/P is about 0.6/0.4) that lattice-matches with the InGaAs light-receiving layer is used as the window layer, the sensitivity to a wavelength range of 1 to 1.5 μm is decreased in both cases of front illumination and rear illumination because InAsP has an absorption band in this wavelength range.

Regarding the light-receiving elements disclosed in NPL 2, no example of a detection device including an array of the light-receiving elements has been reported, and no example of a measurement of the sensitivity etc. of a detection device including such an array has also been reported.

An object of the present invention is to provide a semiconductor wafer, a light-receiving element, a light-receiving element array, a hybrid-type detection device, an optical sensor device, and a process for production of a semiconductor wafer, all of which have a high light-receiving sensitivity in the near-infrared region.

Solution to Problem

A semiconductor wafer of the present invention is used for producing a light-receiving element or light-receiving element array that receives near-infrared light. This semiconductor wafer is characterized in that the semiconductor wafer includes an InP substrate and a multiquantum well structure (MQW) located on the InP substrate, the MQW has a laminated structure including pairs of an $In_xGa_{1-x}As$ (0.38≤x≤0.68) layer and a $GaAs_{1-y}Sb_y$ (0.25≤y≤0.73) layer, and in the $GaAs_{1-y}Sb_y$ layer, the Sb content y in a portion on the InP substrate side is larger than the Sb content y in a portion on the opposite side.

In an MQW of type-II InGaAs/GaAsSb, in light reception, a hole is generated in the valence band of GaAsSb, and an electron is generated in the conduction band of InGaAs (indirect transition). Hereinafter, a description will be made while attention is paid to the hole in the valence band of GaAsSb. In a $GaAs_{1-y}Sb_y$ (0.25≤y≤0.73) layer (hereinafter referred to as "GaAsSb layer" unless otherwise specified), the smaller the Sb content y, the lower the top of the valence band of the band. That is, the bottom of a quantum well of a hole in the valence band becomes close to the top of the barrier of the lattice well (the boundary with the valence band of adjacent InGaAs). According to the above structure, in a GaAsSb layer of an MQW, the bottom of a quantum well of a hole in the valence band is deep in a portion on the InP substrate. On the other hand, in a portion on the opposite side, the bottom of the quantum well is shallower than that in the portion on the InP substrate side. Therefore, a hole that is driven by a reverse bias electric field and moves in the MQW to the opposite side of the InP substrate need not overcome a barrier of the quantum well from the deep bottom in one go. For example, the hole reaches a barrier by first reaching a position at an intermediate height or after going up a gentle slope, and thus can easily overcome the barrier. The above-described distribution of the Sb content y results in a "barrier-overcoming auxiliary mechanism". Consequently, even when a hole is generated in the MQW close to the InP substrate, the hole can overcome several hundred multiquantum wells and reach an electrode on the opposite side of the InP substrate. In the case where such a barrier-overcoming auxiliary mechanism of a quantum well is not provided, many of the holes generated in a region of the MQW near the InP substrate disappear on the way and do not carry light reception information. As in the present invention, in the $GaAs_{1-y}Sb_y$ layer, by controlling the Sb content y in a portion on the InP substrate side to be larger than the Sb content y in a portion on the opposite side, the light-receiving sensitivity can be improved.

The phrase "in the $GaAs_{1-y}Sb_y$ layer, the Sb content y in a portion on the InP substrate side is larger than the Sb content y in a portion on the opposite side" refers to the following. That is, an average Sb content y (in the range from a portion that contacts InGaAs on the InP substrate side to the center in the thickness direction of the GaAsSb layer) is larger than an average Sb content y (in the range from the center in the thickness direction of the GaAsSb layer to a portion that contacts InGaAs on the side opposite to the InP substrate).

In the description below, the top of the valence band of the band for electrons is referred to as "bottom" unless otherwise stated. In the case where the state of a hole is discussed using the band for electrons, literal interpretation may cause confusion in some points. However, in any case, interpretation should be performed in accordance with the gist of the present invention, the gist being apparent from the context.

In the $GaAs_{1-y}Sb_y$ layer, the Sb content y may be decreased in a stepwise manner or in a constant manner from the InP substrate side to the opposite side. With this structure, it is possible to obtain a semiconductor wafer in which a hole in the valence band can smoothly drift to the side opposite to the InP substrate in the MQW in the case where light is incident from the substrate side.

In the $GaAs_{1-y}Sb_y$ layer, the Sb content y in the portion on the InP substrate side may be in the range of 0.49 to 0.73, and the Sb content y in the portion on the opposite side may be in the range of 0.25 to 0.49. With this structure, it is possible to obtain an operation of reducing a barrier against the drift of a hole in the valence band of GaAsSb to the side opposite to the substrate, while reducing the lattice defect density.

Instead of the InGaAs layer, any one of InGaAsN, InGaAsNP, and InGaAsNSb may form a pair with the $GaAs_{1-y}Sb_y$ ($0.25 \leq y \leq 0.73$) layer to form the MQW. With this structure, the light-receiving sensitivity can be extended to the longer-wavelength side.

A light-receiving element of the present invention includes an InP substrate, a light-receiving layer having an MQW and located on the InP substrate, a contact layer located on the light-receiving layer, a p-type region extending from a surface of the contact layer to the light-receiving layer, and a p-side electrode that forms an ohmic contact with the p-type region. The light-receiving element is characterized in that the MQW has a laminated structure including pairs of an $In_xGa_{1-x}As$ ($0.38 \leq x \leq 0.68$) layer and a $GaAs_{1-y}Sb_y$ ($0.25 \leq y \leq 0.73$) layer, and in the $GaAs_{1-y}Sb_y$ layer, the Sb content y in a portion on the InP substrate side is larger than the Sb content y in a portion on the opposite side. With this structure, regardless of the light-receiving position in the MQW, many of the holes generated in light reception can reach the p-side electrode. As a result, even in the case where light is incident from the substrate side, a high light-receiving sensitivity can be maintained.

In the $GaAs_{1-y}Sb_y$ layer, the Sb content y may be decreased in a stepwise manner or in a constant manner from the InP substrate side to the opposite side. With this structure, holes in the valence band can easily drift in the MQW to the side opposite to the InP substrate, and thus the probability of disappearance of holes in the MQW can be reduced. As a result, even in the case where light is incident from the substrate side, the sensitivity of the light-receiving element can be ensured.

In the $GaAs_{1-y}Sb_y$ layer, the Sb content y in the portion on the InP substrate side may be in the range of 0.49 to 0.73, and the Sb content y in the portion on the opposite side may be in the range of 0.25 to 0.49. With this structure, it is possible to obtain an operation of lowering a hurdle that a hole generated in the valence band of GaAsSb has to overcome in order to drift to the side opposite to the substrate, while reducing the lattice defect density. As a result, even when the light-receiving position is close to the InP substrate and a hole is generated at the position close to the InP substrate, a high light-receiving sensitivity can be maintained.

A light-receiving element array of the present invention includes a plurality of any of the above-described light-receiving elements, and an InP substrate on which the light-receiving elements are arranged. The light-receiving element array is characterized in that the p-type region is provided for each of the light-receiving elements, adjacent light-receiving elements are separated by a region that is not the p-type region, and the p-side electrode is arranged for each of the p-type regions.

With this structure, for example, the intensity distribution (intensity-wavelength curve) of near-infrared light separated into spectral components can be measured. Light-receiving elements at respective positions have a sensitivity up to a long-wavelength region of the near-infrared region. Thus, a high-quality intensity distribution can be measured for a biological component having a plurality of absorption bands, etc. The light-receiving element array may be a one-dimensional array or a two-dimensional array.

The p-type region may be a region formed by selectively diffusing Zn from a surface of the contact layer, or a region that is formed by being doped with a p-type impurity at the time of the growth of epitaxial layers including the contact layer and the MQW and that is surrounded by an n-type region formed by selective diffusion of an n-type impurity. With this structure, each pixel can be formed so as to be electrically or semiconductively separated from adjacent pixels without degrading the crystal quality caused by mesa etching or the like and without increasing a dark current or the like caused by this degradation.

A hybrid-type detection device of the present invention includes the above light-receiving element array, and a read-out circuit formed in silicon. The hybrid-type detection device is characterized in that a read-out electrode of the read-out circuit is conductively connected to each p-side electrode of the light-receiving element array.

With this structure, a detection device which targets near-infrared light and whose size and weight are significantly reduced as compared with existing detection devices can be obtained. Accordingly, it is possible to obtain a device for detecting near-infrared light, the device being suitable for a portable use, an insertion examination for a biological object, and other applications.

In the hybrid-type detection device, light may be incident from a rear surface of the InP substrate of the light-receiving element array.

In the light-receiving element array, immediately after light incidence, even when the light is received at a position near the InP substrate which easily receives light and a hole is located at a ground level of the valence band, in the drift of the hole to the side opposite to the InP substrate under a reverse bias voltage, the hole can relatively easily overcome barriers because the energy at the position of the hole becomes close to the top of the well barrier toward the opposite side due to the barrier-overcoming auxiliary mechanism described above. As a result, the probability that holes generated in the valence band reach the pixel electrode increases, though the holes must overcome a large number of multiquantum wells. Consequently, a detection device having a high light-receiving sensitivity can be obtained.

An optical sensor device of the present invention is characterized by including any of the above-described semiconductor wafers, any of the light-receiving elements, any of the light-receiving element arrays, or any of the hybrid-type detection devices.

The optical sensor device is obtained by combining any of the light-receiving element array and the hybrid-type detection device with an optical element such as an optical system, e.g., a spectroscope or a lens. Accordingly, a wavelength distribution measurement can be performed, the optical sensor device can be used as an imaging device, or various practically useful products can be obtained. Specific examples of the optical sensor device include (i) imaging devices for supporting visibility or monitoring, (ii) examination devices such as a biological component detection device, a moisture detector, and a food quality examination device, and (iii) monitoring devices for examining a component of combustion gas. In short, the optical sensor device may be any device obtained by combining the light-receiving element, the light-receiving element array, or the hybrid-type detection device described above with an optical element such as a lens, a filter, an optical fiber, a diffraction grating, or a spectral lens. In the case where screen display is performed or a determination is made, a microcomputer, a screen display device, or the like may further be added.

In a process for production of a semiconductor wafer of the present invention, a semiconductor wafer used for producing a light-receiving element or light-receiving element array that receives near-infrared light is produced. The production process includes a step of growing a light-receiving layer having an MQW on an InP substrate. This process is characterized in that, in the step of growing the MQW, an $In_xGa_{1-x}As$ ($0.38 \leq x \leq 0.68$) layer and a $GaAs_{1-y}Sb_y$ ($0.25 \leq y \leq 0.73$) layer are grown so as to form pairs, and the $GaAs_{1-y}Sb_y$ layer is grown so that the Sb content y in a portion on the InP substrate side is larger than the Sb content y in a portion on the opposite side.

A process for production of a light-receiving element array includes a step of growing an MQW light-receiving layer on an InP substrate, a step of growing a contact layer on the light-receiving layer, and a step of forming a p-type region for each light-receiving element by selectively diffusing a p-type impurity from a selective diffusion mask pattern provided on the contact layer so as to reach the light-receiving layer. This process is characterized in that, in the step of growing the MQW, $In_xGa_{1-x}As$ ($0.38 \leq x \leq 0.68$) layers and $GaAs_{1-y}Sb_y$ ($0.25 \leq y \leq 0.73$) layers are grown so as to form pairs, and the $GaAs_{1-y}Sb_y$ layers are grown so that the Sb content y in a portion on the InP substrate side is larger than the Sb content y in a portion on the opposite side.

A light-receiving element array having a high sensitivity in the near-infrared region or a semiconductor wafer used for producing the light-receiving element array can be easily produced by employing an existing production process.

Advantageous Effects of Invention

The light-receiving element etc. of the present invention can have a good sensitivity in the near-infrared region even in the case where light is incident from the substrate side while a hole is used as signal charge.

REFERENCE SIGNS LIST

1 InP substrate, 2 buffer layer, 3 light-receiving layer, 4 diffusion concentration distribution control layer, 5 contact layer, 10 hybrid-type detection device, 10a interference filter, 11 p-side electrode (pixel electrode), 12 n-side electrode (ground electrode), 15 p-n junction, 20 optical sensor device, 31 bonding bump, 35 antireflection film, 36 selective diffusion mask pattern, 37 passivation film, 50 light-receiving element array, 60 control device, 61 display device (display monitor), 63 light source, 64 irradiation optical fiber, 65 information-carrying optical fiber, 67 actuator, 68 concave mirror, 69 filter, 70 CMOS (read-out circuit), 71 pad (read-out electrode), 72 ground electrode, 85 control unit, 85b microcomputer, 85c display unit, 91 diffraction grating (spectroscope), P pixel.

DESCRIPTION OF EMBODIMENTS

<Problem in Hybrid-Type Detection Device Prior to the Present Invention>

A problem, which will be described here, regarding a hybrid-type detection device in the latest technology prior to the present invention, the device including a light-receiving layer having a type-II MQW for the near-infrared region, has not yet been known.

Figure 14:
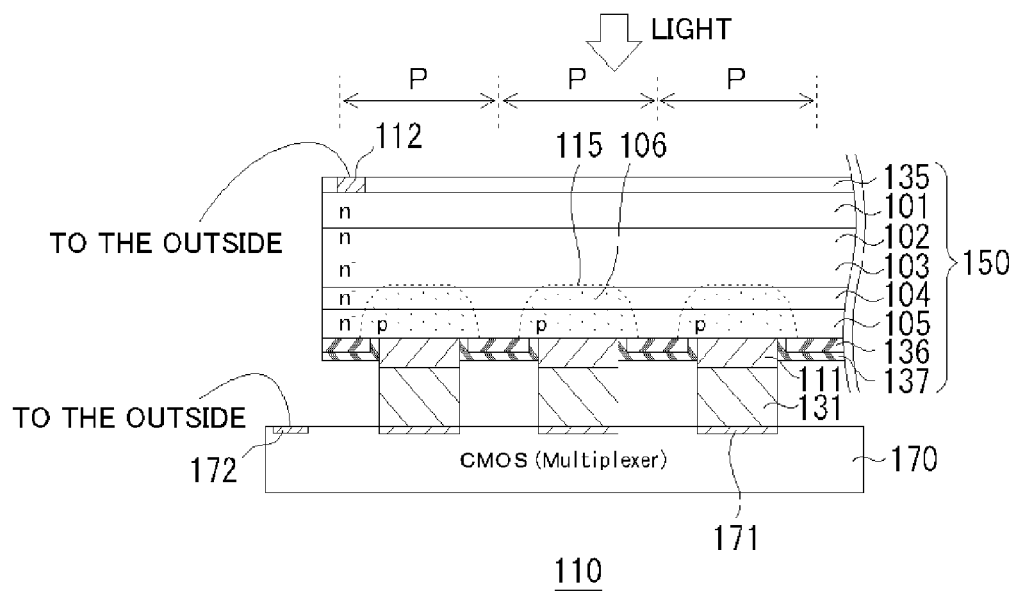
FIG. 14 is a view illustrating a hybrid-type detection device including a light-receiving element array prior to the present invention and a CMOS constituting a read-out circuit.

FIG. 14 is a view illustrating a hybrid-type detection device 110 including a light-receiving element array 150 in the latest technology prior to the present invention and a CMOS 170 constituting a read-out circuit (ROTC). The light-receiving element array 150 has the following laminated structure.

InP substrate 101/n$^+$-type InP (or InGaAs) buffer layer 102/light-receiving layer 103 having type-II MQW composed of (InGaAs/GaAsSb)/InGaAs selective diffusion concentration distribution control layer 104/InP contact layer 105

Light is incident from the InP substrate 101 side. That is, this incidence of light is referred to as "substrate illumination". On the other hand, the incidence of light from the p-type contact layer 105 side is referred to as "contact layer illumination". Light-receiving elements or photodiodes each include a p-n junction 115 located at a leading end of a p-type region 106 that is introduced from the surface of the InP contact layer 105 by selective diffusion. The light-receiving elements are separated from each other by a region that is not subjected to the selective diffusion. A selective diffusion mask pattern 136 used in the selective diffusion is left as it is, and the selective diffusion mask pattern 136 is covered with a passivation film 137.

An electrode of each of the light-receiving elements or a pixel electrode (p-side electrode) 111 is arranged so as to form an ohmic contact with the p-type region 106 on the surface of the InP contact layer 105. A ground electrode (n-side electrode) 112 is common to the light-receiving elements and is arranged so as to form an ohmic contact with the n-type InP substrate 101. A pad 171 forming a read-out electrode of the CMOS 170 is conductively connected to the pixel electrode 111 with a bonding bump 131 therebetween. A ground electrode 172 of the CMOS 170 and the ground electrode 112 of the light-receiving element array 150 are grounded to the outside.

In light reception, a reverse bias voltage is applied to the p-n junction 115. Specifically, a voltage is applied between the pixel electrode 111 and the ground electrode 112 so that the voltage of the ground electrode 112 is higher than that of the pixel electrode 111. A depletion layer spreads in the light-receiving layer 103 having the type-II MQW, and electron-hole pairs are generated by light that reaches the depletion layer. Since the light-receiving layer 103 has a type-II MQW, a hole is generated in the valence band of GaAsSb and an electron is generated in the conduction band of InGaAs. Since the voltage of the pixel electrode 111 is lower than that of the ground, the pixel electrode 111 collects holes and the holes form pixel information. By reading out the hole charge at predetermined time intervals, an image, the intensity distribution of a measurement signal, or the like can be formed.

Figure 15A:
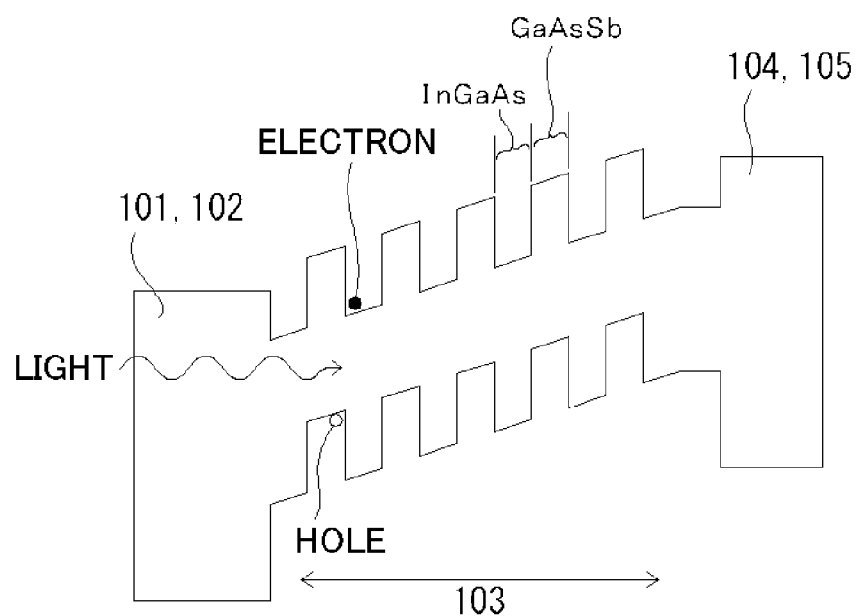
FIG. 15A is an energy band diagram in the case where light is incident from the substrate side, and illustrates an energy band in the case where a light-receiving layer has a type-II MQW.
Figure 15B:
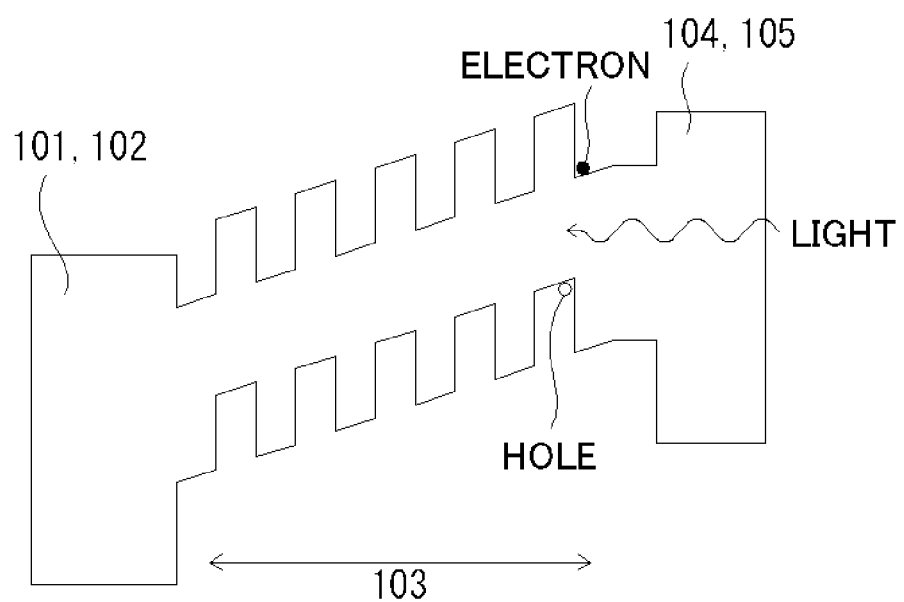
FIG. 15B is an energy band diagram in the case where light is incident from the contact layer side, and illustrates an energy band in the case where a light-receiving layer has a type-II MQW.

As illustrated in FIGS. 15A and 15B, in the type-II MQW constituting the light-receiving layer 103, a hole is generated in the valence band of GaAsSb and an electron is generated in the conduction band of InGaAs by light reception. Specifically, an electron in the valence band of GaAsSb is excited to the conduction band of InGaAs by light, thereby generating a hole in the valence band of GaAsSb. The band diagrams illustrated in FIGS. 15A and 15B are each a band diagram for electrons. Therefore, regarding a hole, the relationship is inverted in the vertical direction. FIG. 15A illustrates a case of substrate illumination, as illustrated in FIG. 14. FIG. 15B illustrates a case of contact layer illumination, in which light is incident from the opposite side of the substrate. In the case of substrate illumination, since a depletion layer widely extends into the light-receiving layer toward the InP substrate side, light is immediately received in the depletion layer at a position close to the substrate to generate a hole. As illustrated in FIG. 15A, the hole must pass through the light-receiving layer 103 having the MQW while overcoming a large number of high barriers, and reach the contact layer 105, though the hole is driven by a reverse bias electric field.

Comparing FIG. 15A with FIG. 15B, in the case of substrate illumination, a hole generated by light reception cannot reach the pixel electrode 111 without overcoming a large number of multiquantum wells. In contrast, in the case of contact layer illumination, light is received at a position in the MQW close to the pixel electrode 111, and thus a hole need not overcome a large number of multiquantum wells in order to reach the pixel electrode 111.

In the case of substrate illumination, a hole must overcome innumerable barriers, in the valence band in order to drift to the contact layer 105 side under a reverse bias voltage. Therefore, the number of holes that reach the p-type region 106 or the pixel electrode 111 is significantly decreased from the number of holes generated by light reception. As a result, the light-receiving sensitivity decreases. It is known that the effective mass of a hole is originally larger than that of an electron, and thus the mobility of the hole is small. However, the above decrease in the light-receiving sensitivity cannot be explained by such a general magnitude of the mobility. The mechanism of the phenomenon of the above decrease in the light-receiving sensitivity is under investigation. In summary, regarding a light-receiving element array 150 or hybrid-type detection device 110 which includes a light-receiving layer 103 having a type-II MQW and in which a pixel electrode 111 is arranged on a p-type region 106 and a hole is used as signal charge, the following experimental facts were confirmed.

(1) As for a light-receiving element including a light-receiving layer having a type-II MQW, in the case of contact layer illumination, the light-receiving sensitivity or the quantum efficiency of near-infrared light is 0.3 to 0.9. This quantum efficiency is considered to be satisfactory.

(2) However, as for a light-receiving element array including the same light-receiving element, in the case of substrate illumination, the quantum efficiency in the near-infrared region is decreased to a very low value, i.e., 0.05 to 0.5. In the case where a two-dimensional light-receiving element array is used, wiring is provided for each pixel. Accordingly, in order to avoid interruption of light, the interruption being caused by the presence of the wiring, light is inevitably incident from the rear surface side of an InP substrate.

<Points of the Present Invention>

A feature of the present invention lies in the following point. In a light-receiving element array including a light-receiving layer having a type-II InGaAs/GaAsSb MQW, GaAsSb layers in the MQW each have a complex structure so that, in a GaAsSb layer, the Sb content y in a portion of the layer close to an InP substrate (ground electrode) is larger than the Sb content y in a portion of the layer close to a pixel electrode. For example, a GaAsSb layer may be divided into a plurality of sublayers so that the content of Sb is decreased stepwise toward the pixel electrode side. Alternatively, in a GaAsSb layer, the content y may be decreased in a constant manner toward the pixel electrode side. With this structure, even when a hole falls into the ground level of GaAsSb, the hole can relatively easily overcome the top of the barrier of GaAsSb (the boundary with the valence band of adjacent InGaAs) on the pixel electrode side because the energy at the position of the hole becomes higher toward the pixel electrode side. Accordingly, in the light-receiving element or the light-receiving element array of the present invention, the light-receiving sensitivity or the quantum efficiency can be improved even in the case of substrate illumination while a hole is used as signal charge.

(Embodiment 1)

Figure 1:
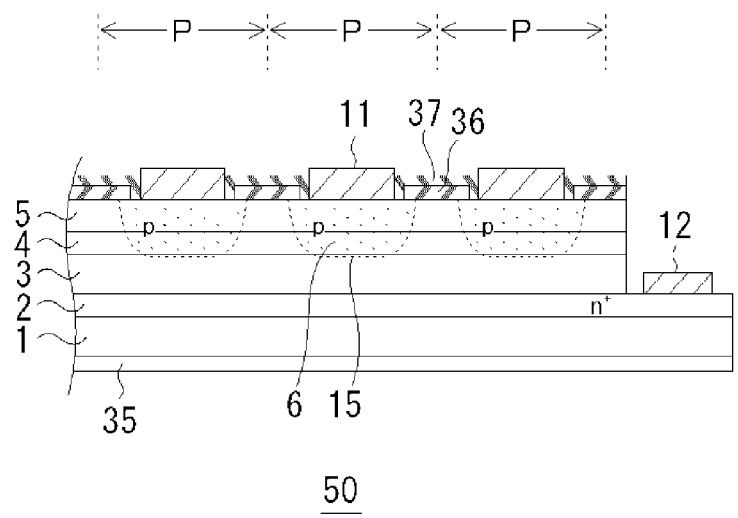
FIG. 1 is a cross-sectional view of a light-receiving element array according to Embodiment 1 of the present invention.
Figure 2:
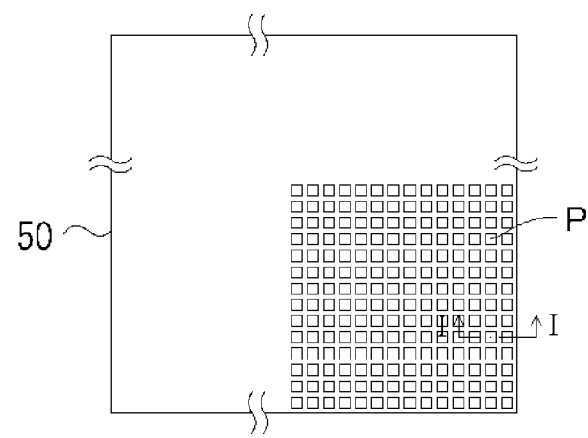
FIG. 2 is a plan view of the light-receiving element array illustrated in FIG. 1.

FIG. 1 is a cross-sectional view of a light-receiving element array 50 according to Embodiment 1 of the present invention. FIG. 2 is a plan view of the light-receiving element array 50, and a ground electrode located on an edge of each chip is omitted in the figure.

The light-receiving element array 50 has a laminated structure of InP substrate 1/n⁺-type InP buffer layer 2/light-receiving layer 3 having type-II MQW/diffusion concentration distribution control layer 4/InP contact layer 5. A p-type region 6 is formed by selectively diffusing Zn from openings of a selective diffusion mask pattern 36 so that Zn reaches the light-receiving layer 3 through the contact layer 5 and the diffusion concentration distribution control layer 4. A p-side electrode or a pixel electrode 11 is arranged on the surface of the p-type region 6 in the contact layer 5 so as to form an ohmic contact. Pixels P each include the p-type region 6 and the pixel electrode 11. Each of the p-type regions 6 is electrically or semiconductively separated from adjacent p-type regions 6 by a region that is not subjected to the selective diffusion. This structure ensures the independence and separation of the pixels P. Furthermore, since mesa etching or the like is not performed, a light-receiving element array 50 with a low dark current can be obtained. The diffusion concentration distribution control layer 4 may not be formed. However, the diffusion concentration distribution control layer 4 may be interposed between the MQW light-receiving layer 3 and the contact layer 5 because when Zn, which is a p-type impurity, is diffused, the Zn concentration in the MQW is conveniently suppressed to a predetermined level or less.

A ground electrode 12 that is common to the pixel electrodes 11 is arranged so as to form an ohmic contact with the n⁺-type InP buffer layer 2. The selective diffusion mask pattern 36 composed of SiN and used for forming the p-type region 6 by performing selective diffusion of Zn is left as it is, and is covered with a passivation film 37 composed of polyimide or the like. The rear surface of the InP substrate 1 is covered with an antireflection film (AR film) 35, which is a SiON film. Regarding the pixels P in the light-receiving element array 50, 320×256 pixels are arranged at a pixel pitch of 30 μm, and the size of each chip is 10 mm in width and 9 mm in length.

This embodiment is characterized in that, in GaAsSb of the type-II MQW constituting the light-receiving layer 3, the Sb content y is varied stepwise so that the Sb content y is low on the pixel electrode 11 side.

Figure 3:
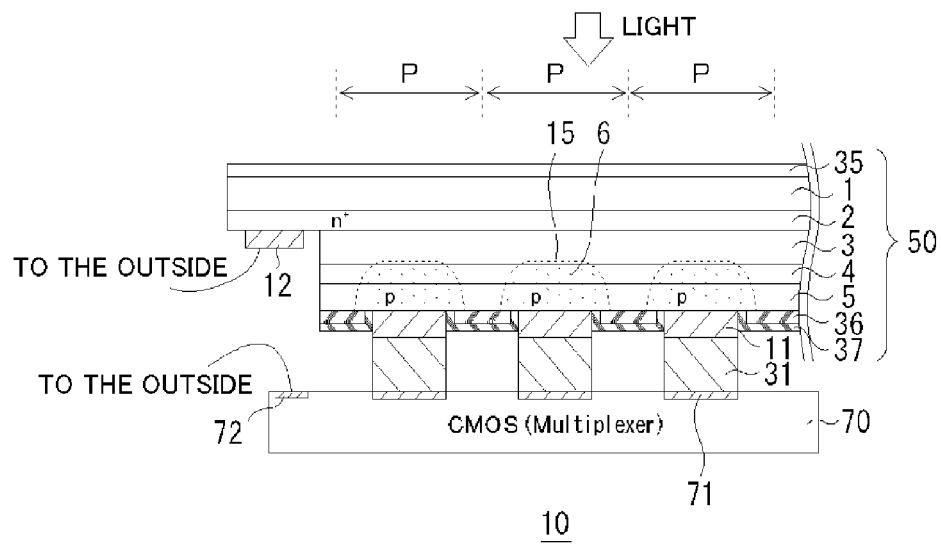
FIG. 3 is a cross-sectional view illustrating a hybrid-type detection device formed by combining the light-receiving element array illustrated in FIG. 1 with a CMOS.

FIG. 3 is a cross-sectional view illustrating a hybrid-type detection device 10 including the light-receiving element array 50 illustrated in FIG. 1. The hybrid-type detection device 10 is formed by combining the light-receiving element array 50 with a CMOS 70 functioning as a read-out circuit (ROIC). Light is incident from the rear surface of an InP substrate, the rear surface having an AR film 35 thereon.

In light reception, in each pixel P, a reverse bias voltage is applied to a p-n junction 15, and a depletion layer widely spreads in the MQW light-receiving layer 3. The light incident on the substrate is received in the MQW light-receiving layer 3 immediately after passing through the InP substrate 1.

As illustrated in FIG. 15A, a hole generated by the light reception passes through the MQW light-receiving layer 103 and reaches the pixel electrode 11, and light reception information of a pixel is read out.

Figure 4A:
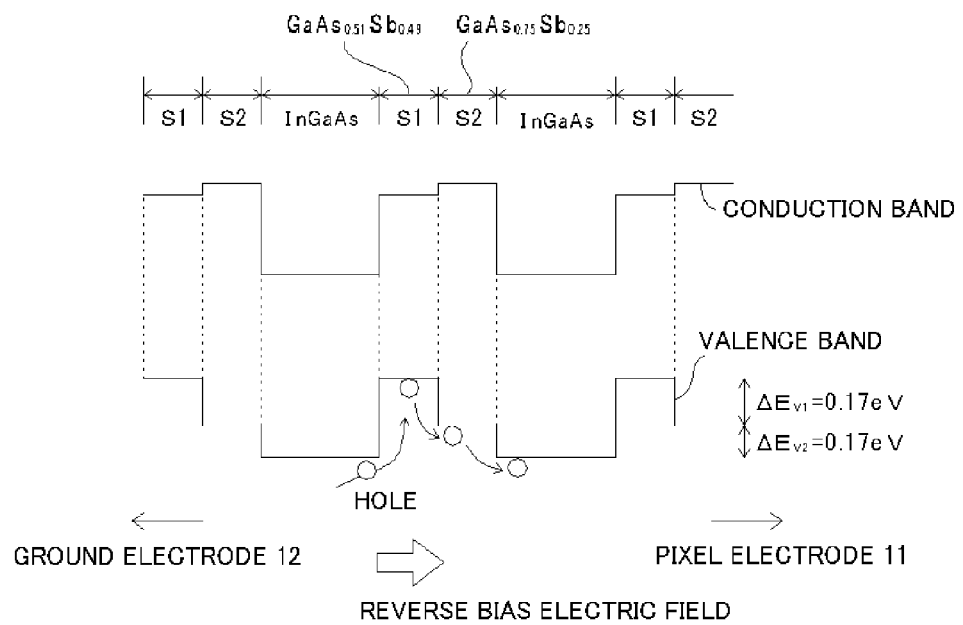
FIG. 4A is a band diagram of a light-receiving layer having a type-II GaAsSb/InGaAs MQW, and illustrates a band of the MQW in which the Sb content y in GaAsSb is reduced stepwise toward the side opposite to an InP substrate.
Figure 4B:
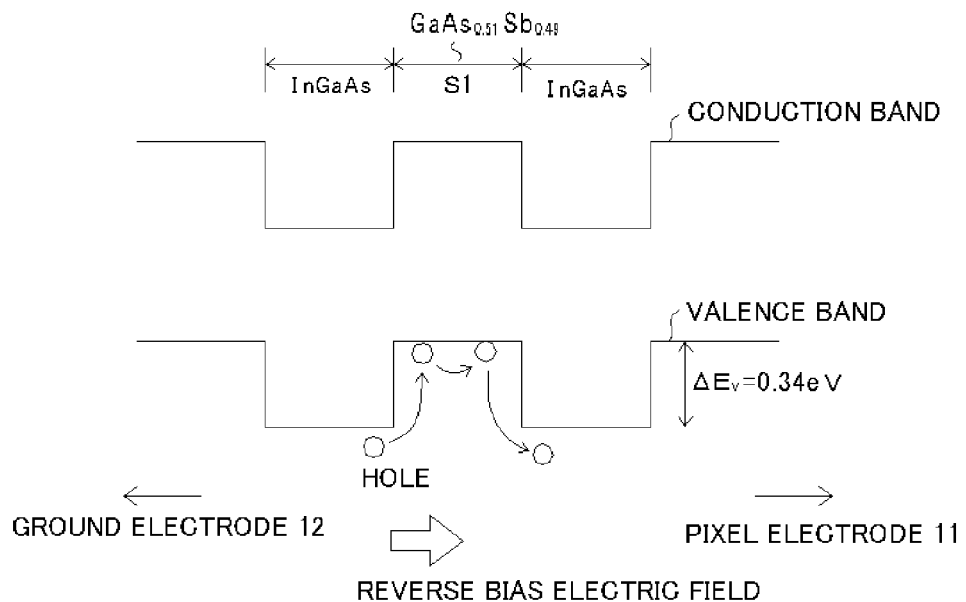
FIG. 4B is a band diagram of a light-receiving layer having a type-II GaAsSb/InGaAs MQW, and illustrates a band of the MQW prior to the present invention.

FIGS. 4A and 4B are schematic diagrams each illustrating a band of a type-II (InGaAs/GaAsSb) MQW constituting a light-receiving layer 3. FIG. 4A illustrates a band of a light-receiving element of the present invention. FIG. 4B illustrates a band of a light-receiving element prior to the present invention. The Sb content y of GaAsSb affects the band. When the Sb content is small, a difference ΔEv between the bottom of a hole of the valence band (the top of the valence band for electrons) of GaAsSb and the bottom of a hole of the valence band (the top of the valence band for electrons) of adjacent InGaAs is small. Accordingly, when a hole generated in GaAsSb is driven by a reverse bias electric field and moves to a pixel electrode, it is necessary that the hole overcome a barrier substantially corresponding to this difference ΔEv.

The Sb content y that realizes lattice matching with InP with the minimum distortion is 0.49. That is, a composition of $GaAs_{0.51}Sb_{0.49}$ is preferable from the standpoint of lattice matching with InP. In this case, the difference ΔEv of GaAsSb is 0.34 eV as shown in FIG. 4B. A hole must overcome several hundred quantum well barriers having the above difference ΔEv and move to the pixel electrode 11.

In contrast, in this embodiment, the Sb content y of GaAsSb is decreased toward the pixel electrode 11 side, as described above. For example, a GaAsSb layer is divided into two sublayers S1 and S2. The S1 sublayer on the InP substrate 1 side has a composition of $GaAs_{0.51}Sb_{0.49}$. The S2 sublayer on the pixel electrode 11 side has a composition of $GaAs_{0.75}Sb_{0.25}$ in which the Sb content y is 0.25. By dividing the GaAsSb layer into the S1 sublayer and the S2 sublayer, a hole in the valence band of GaAsSb can move to the valence band of InGaAs on the pixel electrode side in such a manner that the hole goes up a stair. One step ΔEv1 or ΔEv2 of the stair is reduced to half, i.e., 0.17 eV. In the case of FIG. 4B, in which the GaAsSb layer is not divided into the S1 sublayer and the S2 sublayer, a hole must overcome a barrier of 0.34 eV in one go. In contrast, in the case of FIG. 4A, a hole may go up by 0.17 eV for each step. Therefore, a hole can relatively easily move the quantum wells under the reverse bias electric field oriented to the pixel electrode 11 side.

<Distribution of Sb Content y of GaAsSb>

In the example illustrated in FIG. 4A, the Sb content y is distributed so as to form two steps. Modifications to the distribution of the Sb content y include the following:

(1) A distribution in which the Sb content y is monotonically decreased in three or more steps.

(2) An inverted trapezoid or inverted triangle distribution in which the Sb content y is monotonically decreased at most positions and the Sb content y is significantly increased in a portion of a thin layer that contacts InGaAs that is adjacent to the thin layer on the contact layer side. This distribution mainly aims to realize both lattice matching and a decrease in the difference ΔEv. However, this distribution is formed under the condition that an average Sb content y (in the range from a portion that contacts InGaAs on the InP substrate side to the center in the thickness direction of the GaAsSb layer) is larger than an average Sb content y (in the range from the center in the thickness direction of the GaAsSb layer to a portion that contacts InGaAs on the side opposite to the InP substrate).

(3) Sloped distribution (4) Combination of sloped portions and flat portions

In short, the content distribution is not particularly limited as long as the valence band of a GaAsSb layer comes close to the boundary with the valence band of InGaAs that is adjacent to the GaAsSb layer on the pixel electrode side.

Next, the light-receiving element array 50 illustrated in FIG. 1, in particular, the light-receiving layer 3 will be more specifically described.

The light-receiving layer 3 is composed of a type-II InGaAs/GaAsSb MQW. The p-n junction 15 is formed at a position corresponding to a boundary front of the p-type region 6. By applying a reverse bias voltage between the pixel electrode 11 and the ground electrode 12, a depletion layer is more widely formed on the side where an n-type impurity concentration is low (n-type impurity background). The background in the MQW light-receiving layer 3 preferably has an n-type impurity concentration (carrier concentration) of about $5\times10^{15}/cm^3$ or less. The position of the p-n junction 15 is determined by an intersection between the background (n-type carrier concentration) of the MQW light-receiving layer 3 and a concentration profile of Zn, which is a p-type impurity. The diffusion concentration distribution control layer 4 may be interposed between the light-receiving layer 3 and the contact layer 5. Alternatively, the diffusion concentration distribution control layer 4 may not be provided. In the case where the diffusion concentration distribution control layer 4 is interposed, the diffusion concentration distribution control layer 4 is preferably composed of InGaAs. This is because even when a portion having a low impurity concentration and extending in the thickness direction (a portion having a certain thickness and located on the light-receiving layer side) is present, the electrical resistance does not tend to increase because of a relatively low band gap energy of InGaAs.

The light-receiving element array 50 that is targeted by the present invention aims to have a light-receiving sensitivity from the near-infrared region to the long-wavelength side of the near-infrared region. Accordingly, the contact layer 5 is preferably composed of a material having a band gap energy larger than the band gap energy of the MQW light-receiving layer 3. For this reason, in general, InP, which is a material that has a band gap energy larger than that of the light-receiving layer and that achieves satisfactory lattice matching, is preferably used as the contact layer 5. Alternatively, InAlAs, which has a band gap energy substantially the same as that of InP, may also be used.

In a type-II MQW, when two different types of semiconductor layers having the same Fermi energy are alternately stacked, the difference in energy between the conduction band of a first semiconductor (InGaAs) and the valence band of a second semiconductor (GaAsSb) determines the upper limit of the wavelength (cutoff wavelength) of the light-receiving sensitivity. That is, the transition of an electron or a hole caused by light is performed between the valence band of the second semiconductor, and the conduction band of the first semiconductor (indirect transition). Accordingly, by controlling the energy of the valence band of GaAsSb to be higher than the energy of the valence band of InGaAs, and by controlling the energy of the conduction band of InGaAs to be lower than the energy of the conduction band of GaAsSb, the light-receiving sensitivity can be easily extended to the long-wavelength side, as compared with the case of the direct transition performed in a single semiconductor.

The light-receiving element array 50 is produced by the process described below.

An n-type InGaAs buffer layer 2 (or an n-type InP buffer layer 2) having a thickness of 2 μm is deposited on an InP substrate 1. Subsequently, an MQW light-receiving layer 3 composed of (InGaAs/GaAsSb) or (GaInNAs/GaAsSb) is formed. The composition of InGaAs is $In_{0.53}Ga_{0.47}As$ so that InGaAs is lattice-matched with InP. The composition of the S1 sublayer composed of GaAsSb is $GaAs_{0.51}Sb_{0.49}$. In FIG. 4A, 0.25 is exemplified as the Sb content y of the S2 sublayer. However, this is an example of the lower limit, and the Sb content y is preferably set to 0.40, which is higher than 0.25. Thus, the degree of lattice matching (|Δa/a|: where a represents a lattice constant of the InP substrate and Δa represents a difference in the lattice constant between two layers) can be made to be 0.002 or less.

The method for growing the S1 sublayer and the S2 sublayer of the GaAsSb layer is as follows. In the case where a light-receiving layer is grown by molecular beam epitaxy (MBE), the growth of the S1 sublayer of the GaAsSb layer is started by opening shutters of Ga, As, and Sb. At the same time with the finish of the growth of the S1 sublayer, the shutters of Ga and Sb are closed while the shutter of As remains opened, and the growth is interrupted. During the interruption of the growth, the degrees of openings of valved cells of As and Sb are changed to those for the S2 sublayer. After the interruption of about 5 seconds, the growth is restarted to grow the S2 sublayer.

The InGaAs layer and the GaAsSb layer, which form a unit quantum well structure, each have a thickness of 5 nm, and the number of pairs (the number of repetitions of the unit quantum well) is 250. Subsequently, as a diffusion concentration distribution control layer 4, which functions in the introduction of Zn by diffusion, an InGaAs layer having a thickness of 1 μm is epitaxially grown on the light-receiving layer 3. Lastly, an InP contact layer 5 having a thickness of 1 μm is then epitaxially grown. Both the light-receiving layer 3 and the diffusion concentration distribution control layer 4 are preferably epitaxially grown by MBE. The InP contact layer 5 may be epitaxially grown by MBE. Alternatively, the InP substrate 1 may be taken out from an MBE apparatus after the growth of the diffusion concentration distribution control layer 4, and the InP contact layer 5 may be epitaxially grown by metal organic vapor phase epitaxy (MOVPE).

The InP substrate 1 may contain an n-type impurity such as Si at a predetermined level or more. In this case, the ground electrode 12 can be arranged so as to form an ohmic contact with the InP substrate 1. For example, an n-type dopant such as Si is preferably incorporated in an amount of about $1\times10^{17}/cm^3$ or more. The InP substrate 1 may be an Fe-doped semi-insulating InP substrate. In this case, the ground electrode 12 can be arranged so as to form an ohmic contact with the $n^+$-type InP buffer layer 2, as illustrated in FIG. 1.

The MQW light-receiving layer 3 composed of InGaAs/GaAsSb, the diffusion concentration distribution control layer 4 composed of InGaAs, and the InP contact layer 5 are preferably non-doped. Alternatively, these layers may be doped with a trace amount (for example, about $2\times10^{15}/cm^3$) of an n-type dopant such as Si.

As described above, a p-type impurity is introduced into the inside of a peripheral portion of the light-receiving element by diffusion so that the diffusion in the peripheral portion is two-dimensionally limited by performing selective diffusion using the selective diffusion mask pattern 36. Accordingly, the p-n junction 15 is not exposed to an end face of the light-receiving element. The p-type region 6 is limited inside each pixel P. A plurality of the pixels P are arranged without forming an element separation trench, and each pixel P is reliably separated from adjacent pixels P. As a result, the leakage of a photocurrent is suppressed.

In FIG. 1, the p-n junction 15 should be broadly interpreted as follows. In the light-receiving layer 3, when a region on a side opposite to a surface from which the p-type impurity element Zn is introduced by selective diffusion is an impurity region (referred to as "i region") in which the impurity concentration is low enough for the impurity region to be considered as an intrinsic semiconductor, a junction formed between this i-region and the p-type region 6 formed by the selective diffusion is also included in the p-n junction. That is, the p-n junction 15 described above may be a pi junction or the like. Furthermore, the p-n junction 15 also includes the case where the p concentration in the pi junction is very low.

As described above, the p-type region 6 is formed, using a SiN selective diffusion mask pattern 36 formed on the surface of the InP contact layer 5, by selectively diffusing Zn from an opening of the selective diffusion mask pattern 36 so that the p-type region 6 reaches the InGaAs/GaAsSb (or InGaAsN/GaAsSb) MQW light-receiving layer 3. A front leading end of the p-type region 6 forms the p-n junction 15. The Zn concentration distribution near the p-n junction 15 is a distribution showing a graded type junction.

According to the above production process, adjacent light-receiving elements in the photodiode array 50 are separated from each other by performing selective diffusion of Zn (diffusion that is two-dimensionally limited so that a diffused portion is disposed inside a peripheral portion of each light-receiving element) without performing mesa etching for element separation. Specifically, the Zn selective diffusion region 6 forms a main portion of one pixel portion P and regions where Zn does not diffuse separate respective pixels from each other. Therefore, the photodiode array does not suffer from, for example, crystal damage caused by mesa etching, and thus a dark current can be suppressed.

In the case where the p-n junction 15 is formed by selective diffusion of an impurity, the impurity diffuses not only in the depth direction but also in the lateral direction (the direction orthogonal to the depth direction). Thus, there is a concern that the distance between elements cannot be decreased to a certain dimension or less. However, according to an experimental result of selective diffusion of Zn, it was confirmed that, in the structure in which the InP contact layer 5 is disposed on the top surface and the InGaAs diffusion concentration distribution control layer 4 is disposed under the InP contact layer 5, the area of the diffusion in the lateral direction is substantially the same as or smaller, than the area of the diffusion in the depth direction. That is, in selective diffusion of Zn, although Zn diffuses in the lateral direction so that the diameter of a diffusion region is larger than the diameter of an opening of the selective diffusion mask pattern 36, the degree of diffusion is small and the region is only slightly expanded from the opening of the selective diffusion mask pattern 36, as schematically illustrated in, for example, FIG. 1. The selective diffusion mask pattern 36 and the InP contact layer 5 are covered with the passivation film 37 composed of SiON or the like.

The InP substrate 1 is preferably an off-angle substrate which is tilted at 5 to 20 degrees from (100) in the [111] direction or the [11-1] direction. More preferably, the substrate is tilted at 10 to 15 degrees from (100) in the [111] direction or the [11-1] direction. By using such a substrate having a large off-angle, it is possible to obtain an InGaAs buffer layer 2, a type-II MQW light-receiving layer 3, and an InGaAs diffusion concentration distribution control layer 4, all of which have a low defect density and good crystal quality.

<Semiconductor Wafer>

Figure 5:
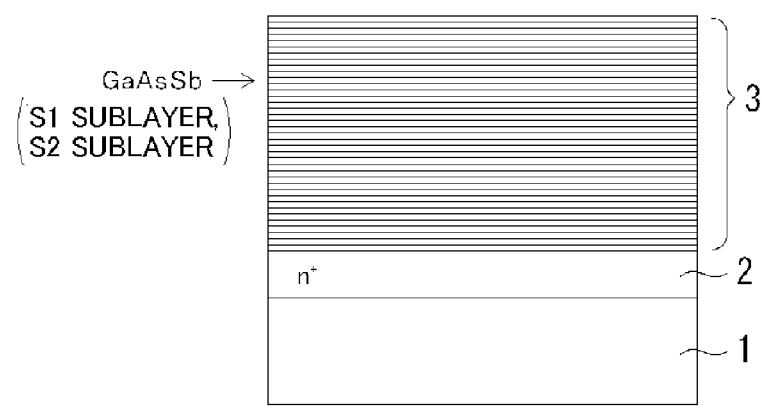
FIG. 5 is a cross-sectional view illustrating a semiconductor wafer of the present invention.

FIG. 5 illustrates a semiconductor wafer having a structure of InP substrate 1/$n^+$-type buffer layer 2/(InGaAs/GaAsSb (S1 sublayer and S2 sublayer) MQW light-receiving layer 3. By using this semiconductor wafer 51, it is possible to produce a light-receiving element array, a hybrid-type detection device, etc. having a satisfactory sensitivity in the near-infrared region using a hole as signal charge in the case of substrate illumination or in the case of contact layer illumination. This semiconductor wafer 51 has a utility that has not been achieved before.

(Embodiment 2—Optical Sensor Device (1)—)

Figure 6:
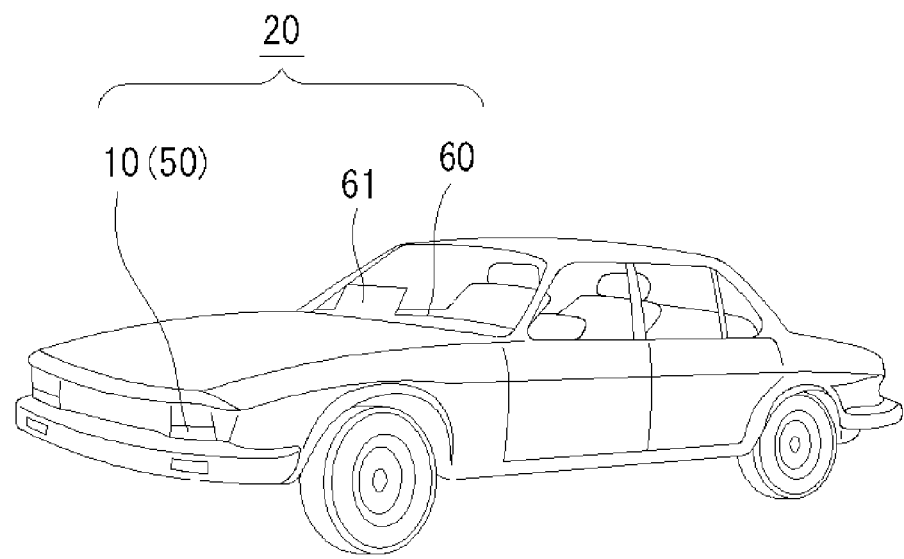
FIG. 6 is a view illustrating an imaging device or a visibility support device, which is an optical sensor device according to Embodiment 2 of the present invention.
Figure 7:
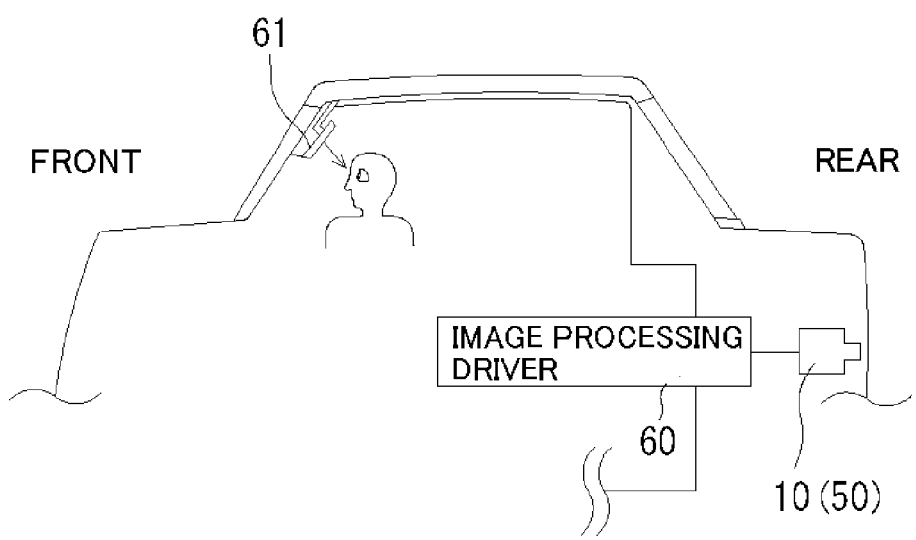
FIG. 7 is a view illustrating a visibility support device for supporting nighttime rear visibility of an automobile.

FIG. 6 is a view illustrating an imaging device or a visibility support device, which is an optical sensor device 20 according to Embodiment 2 of the present invention. The visibility support device is installed in a vehicle in order to support the forward visibility for a driver when driving an automobile at night. A hybrid-type detection device 10 including the light-receiving element array 50 described in Embodiment 1, a CMOS, an optical element such as a lens (not illustrated), etc., a display monitor 61 that displays a captured image, and a control device 60 that controls the driving of the hybrid-type detection device 10 and the display monitor 61 are installed in the vehicle. FIG. 7 is a view illustrating a visibility support device for supporting nighttime rear visibility, the visibility support device being installed in a vehicle in order to support the rear visibility for a driver when driving an automobile at night. An image captured by a hybrid-type detection device 10 including the light-receiving element array 50 described in Embodiment 1, a CMOS, an optical element such as a lens, etc. and installed in the rear of the automobile in the backward direction is displayed on a display device 61 disposed in front of and above the driver's head. Driving of the hybrid-type detection device 10 and the display device 61 are controlled by a control device 60.

In a visibility support device for a vehicle prior to the present invention, an image is formed by receiving light in the near-infrared region reflected or emitted from an object, and thus the following problem occurs. In the case where reflected light is used, a light source is necessary, an installation space of the light source is necessary, and the cost is increased. In the case where radiant heat of an object is used, it is difficult to recognize a non-heat generating object other than a person, and a pedestrian who wears winter clothes etc., and thus it is necessary to use recognition means other than an infrared camera in combination. In addition, in the case where a light source is used, it is necessary to take measures against negative effects on the human body, namely, measures to ensure eye safety in some wavelength ranges to be used.

In the visibility support device in this embodiment, such an extra light source or measures to ensure eye safety are unnecessary. The object whose image is to be captured may generate heat or may not generate heat. Furthermore, a clear image of an object can be obtained even in an environment containing moisture, for example, in fog. Accordingly, it is possible to provide a good visibility support device for a vehicle at night. This is due to the use of a light-receiving element which utilizes reflected light of cosmic light in the short wavelength infra-red (SWIR) band from an object, in which a dark current is sufficiently small, and which has a good dynamic range (S/N).

Visibility support devices for an automobile have been described above. However, the light-receiving element can also be used in other devices such as a night vision device, a navigation support apparatus, an intruder monitoring device, a room monitoring device, and an urban fire monitoring device arranged at a high position.

(Embodiment 3—Optical Sensor Device (2)—)

Figure 8:
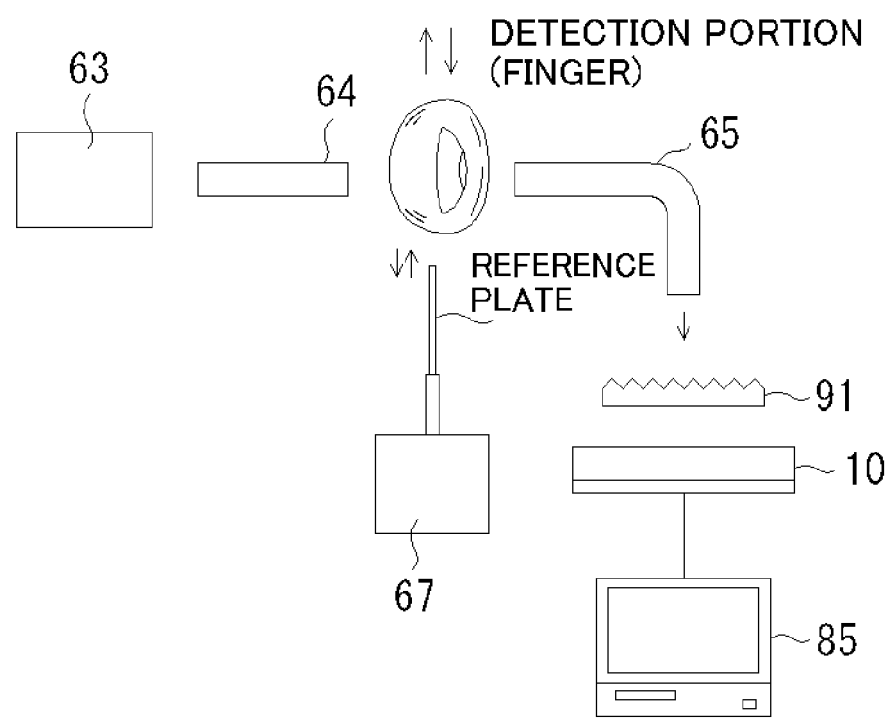
FIG. 8 is a view illustrating a biological component detection device, which is an optical sensor device according to Embodiment 3 of the present invention.

FIG. 8 is a view illustrating a biological component detection device, which is an optical sensor device 20 according to Embodiment 3 of the present invention. In FIG. 8, the above-described hybrid-type detection device 10 is used in a light-receiving unit and a concentration measurement is performed by using an absorption band of glucose, the absorption band being located in a long-wavelength region of the near-infrared region. In this embodiment, the glucose concentration is determined by measuring near-infrared light that is transmitted through a biological object. Alternatively, reflected light of a human body may be used. The light passes through the following path:

light source 63→irradiation optical fiber 64→detection portion (finger)→information-carrying optical fiber 65→diffraction grating (spectroscope) 91→hybrid-type detection device 10→control unit 85

By obtaining an absorption spectrum of a blood component in the detection portion, the absolute value, the relative value, or the magnitude of the blood glucose level can be determined in the control unit 85. In the example illustrated in FIG. 8, light transmitted through a human finger is received, and information on various types of biological tissue such as the skin, the muscle, and the blood can be obtained.

A reference signal is measured on the basis of light transmitted through a reference plate that is driven by an actuator 67 so that the reference plate is retracted when a biological object (finger) is placed in position and the reference plate is placed in position when the biological object is retracted. The thickness of the reference plate is preferably small so that a sufficient amount of transmitted light is obtained, though the thickness depends on the material of the reference plate. The reference plate is moved by the actuator 67 so that variations in position and orientation (angle) are not generated.

The above optical sensor device is an example in which the hybrid-type detection device 10 is installed in the optical sensor device 20 and used for the measurement of the blood glucose level using light transmitted through the human body. Alternatively, the optical sensor device can be applied to the measurement of the blood glucose level, body fat, collagen in the cornea of the eye, a distribution image of facial collagen, and the like using light reflected from the human body.

(Embodiment 4—Optical Sensor Device (3)—)

Figure 9:
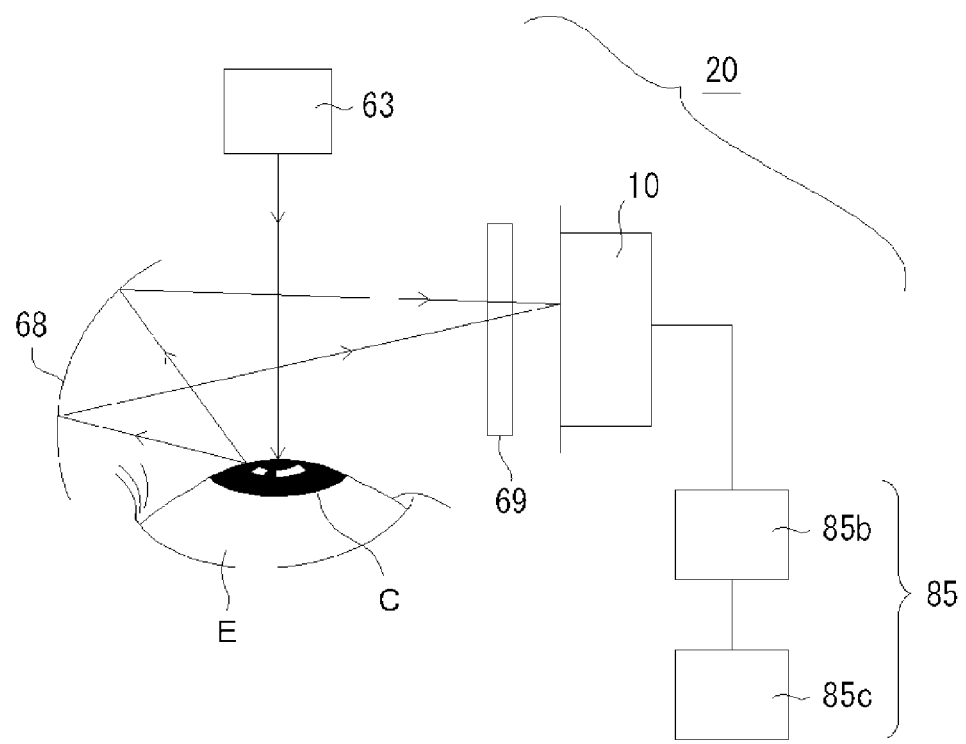
FIG. 9 is a view illustrating a detector of moisture in a biological object (device for forming a moisture distribution image of the eye), which is an optical sensor device according to Embodiment 4 of the present invention.

FIG. 9 is a view illustrating a detector of moisture in a biological object (device for forming a moisture distribution image of the eye), which is an optical sensor device 20 according to Embodiment 4 of the present invention. Many problems of the eye include symptoms related to moisture, such as dry eye and teary eye, and so on When such a symptom occurs, the symptom can be evaluated by taking a moisture distribution image not only on the cornea C but also over the entire front surface of the eye E, as illustrated in FIG. 9. For example, it is possible to determine that the moisture concentration is unusually high at a position corresponding to the lacrimal gland. A concave mirror having a high reflectivity for near-infrared light is preferably used as a concave mirror 68. For example, a concave mirror composed of gold (Au) is used. The concave mirror 68 is disposed not in front of the eye but beside the eye so that light emitted from a light source 63 and reflected from respective portions of the eye is reflected to form an image of the respective portions of the eye on an imaging device, i.e., a hybrid-type detection device 10. A filter 69 preferably transmits light of about 1.4 μm or light of about 1.9 μm that belongs to an absorption band of water. A microcomputer 85b of a control unit 85 forms a moisture distribution image in the eye E on the basis of output signals of pixels of the hybrid-type detection device 10 and displays the image on a display unit 85c. According to the imaging device 10 of the present invention, since the dark current is low and a high sensitivity is obtained up to the long-wavelength side, a clear moisture distribution image having a high S/N ratio can be obtained. Therefore, this moisture distribution image is useful for understanding the function of water and the movement of water in the eye, for example.

Since the eye responses to light very sensitively, it is preferable that the light source 63 be not used. An emission peak of an SWIR cosmic light spectrum can be used as a light source. For example, the wavelength of a certain emission peak of SWIR lies at about 1.4 μm, which belongs to an absorption band of water. Accordingly, the light source 63 is removed and the SWIR cosmic light can be alternatively used. Alternatively, if the artificial light source 63 is used, the light may be limited to the near-infrared region and the peak value of the light may be, for example, double the peak intensity of the SWIR cosmic light. By using the SWIR cosmic light as a light source, eye safety can be reliably realized. The reason why the SWIR cosmic light can be used or a light source having a low intensity level can be used as described above is that the dark current of the hybrid-type detection device 10 constituting an imaging device according to this embodiment can be reduced. That is, the reason is that a clear image can be formed even with a weak signal.

The above optical sensor device is an example of a detector of moisture in the eye, which is a part of a biological object. Alternatively, the optical sensor device can be applied to, for example, the measurement of moisture in natural products (such as the measurement of moisture in a melon (quality certification), the measurement of the mixing ratio of unhusked rice utilizing the moisture content, and the measurement of moisture in other fruits, dried layer seaweed, fishes and shellfishes, dairy products, or the like), the measurement of moisture in the cornea in a corneal corrective surgery, the measurement of moisture in a biological object such as the facial skin, the measurement of moisture in paper products, the measurement of moisture in oil in an automatic oil draining device, the measurement of moisture in a dehydrated cake of polluted sludge, the measurement of moisture in coal, and the measurement of moisture in clothes in a cloth drier.

(Embodiment 5—Optical Sensor Device (4))

Figure 10:
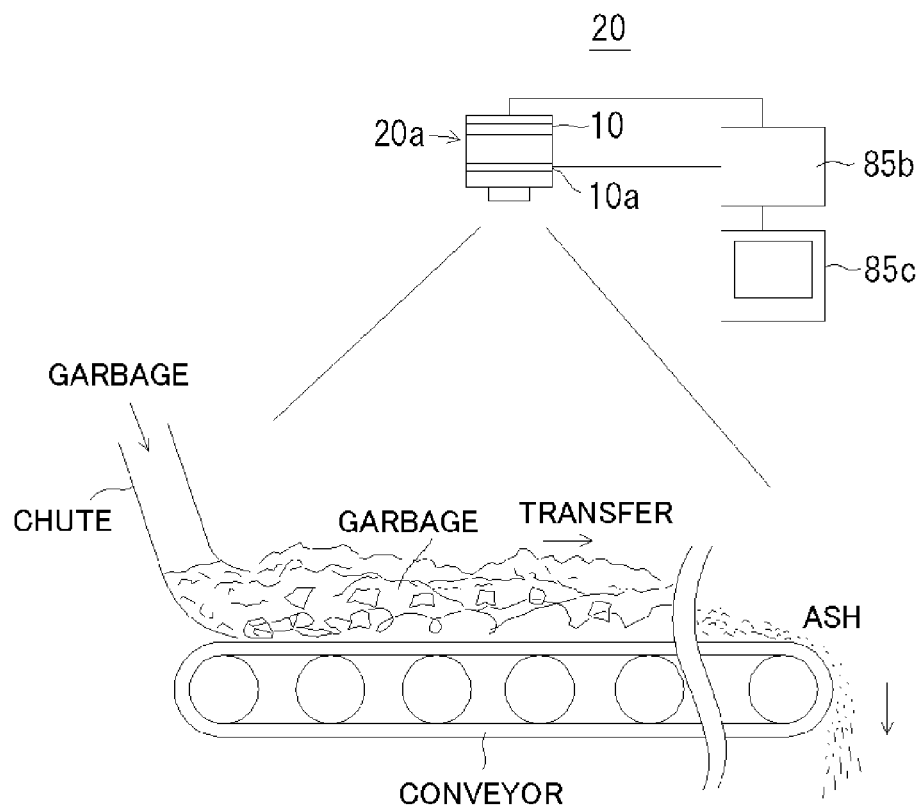
FIG. 10 is a view illustrating a device for measuring a temperature distribution of garbage in a combustor, the device being an optical sensor device according to Embodiment 5 of the present invention.
Figure 11:
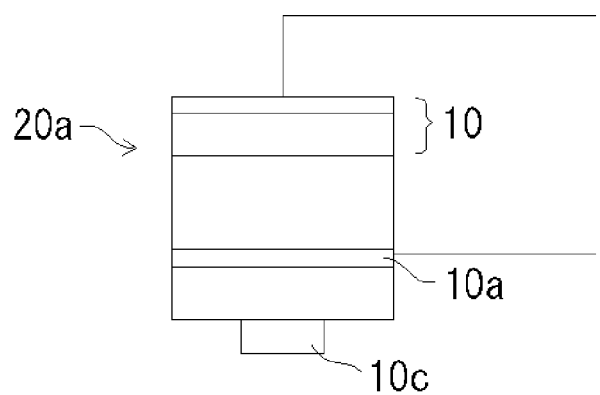
FIG. 11 is a view illustrating a temperature distribution imaging device in FIG. 10.
Figure 12:
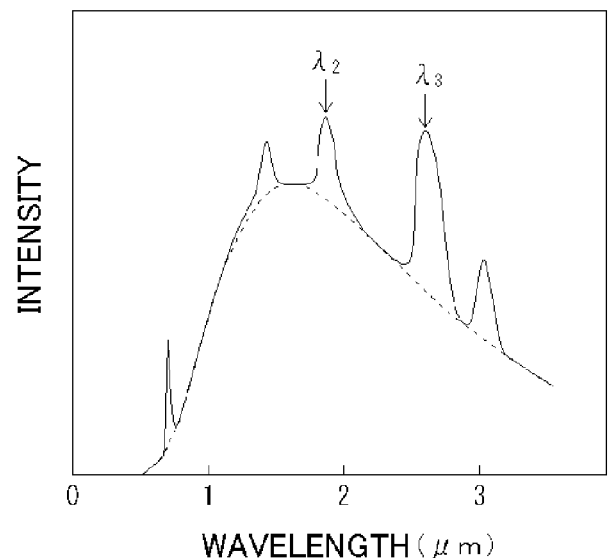
FIG. 12 is a graph showing a near-infrared spectrum in a combustor.
Figure 13:
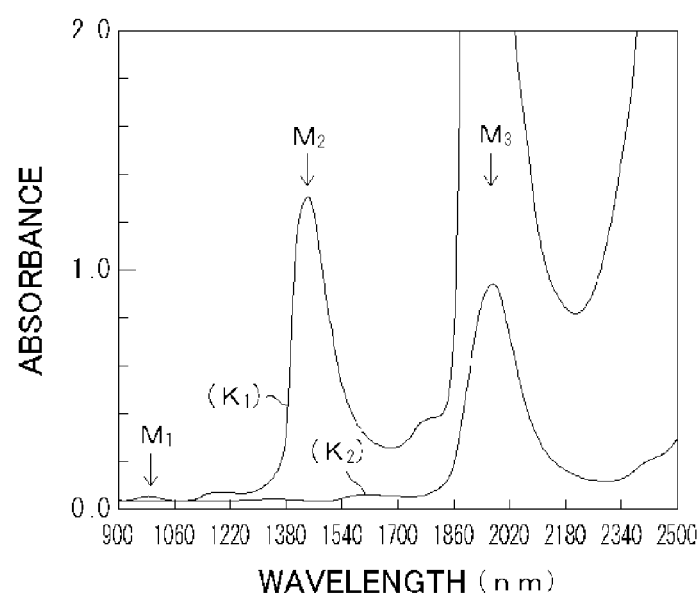
FIG. 13 is a graph showing an absorption spectrum of water.

FIG. 10 illustrates a temperature distribution measuring device for obtaining a temperature distribution of garbage in a combustor, the temperature distribution measuring device being an optical sensor device 20 according to Embodiment 5 of the present invention. The temperature distribution measuring device is a specific example of an environment monitoring device for determining the concentration of a component in gas. FIG. 11 is a view illustrating a temperature distribution imaging device 20a. In the combustor, carbon or hydrocarbons are present in the form of a block, and thus are not present in the form suitable for a fuel. Accordingly, the amount of soot is small, and a large amount of moisture is present. FIG. 12 shows a near-infrared spectrum in a combustor, and emission spectrum wavelengths $\lambda_2$ and $\lambda_3$ of water are noticeably observed. In this embodiment, the concentration and the temperature of water are monitored by utilizing a phenomenon that an emission spectrum of water changes depending on the temperature, and by using an absorption spectrum of water shown in FIG. 13 in combination. In FIG. 13, (K1) and (K2) were measured using cuvette cells with a size of 10 mm and 1 mm, respectively. Since the intensity of the emission spectrum is also proportional to the concentration of water, it is difficult to perform measurement with high accuracy using only the two emission peak wavelengths. Therefore, the absorption spectrum is also used in combination.

In the temperature distribution imaging device 20a, an interference filter 10a is important. The interference filter 10a is a filter having transmission wavelengths at the above-mentioned emission peak wavelengths $\lambda_2$ and $\lambda_3$ of water, and a plurality of absorption peak wavelengths. For example, regarding the absorption peak wavelengths, as shown in FIG. 13, the absorption spectrum has two sharp peaks M2 and M3 in the near-infrared region. The interference filter 10a passes light having these wavelengths. Accordingly, as for the interference filter 10a, a total of four types of filters having transmission wavelengths including the above two emission peak wavelengths, or filters having four transmission wavelengths are arranged. It is preferable to provide an automatic selection mechanism that automatically selects these four types of interference filters by an external operation. An optical system 10c such as a lens also preferably includes an automatic focusing mechanism that automatically adjusts the focus. For example, an image of garbage or a slightly upper portion of the garbage is captured with respect to light having four wavelengths in accordance with the above four types of interference filters. Thus, an image corresponding to the four wavelengths can be obtained.

The intensities of light at the above wavelengths may be determined in advance with respect to air having various water vapor temperatures and various water vapor concentrations, thereby determining a regression equation of the temperature. This temperature regression equation is stored in a microcomputer 85b of a control unit 85. By conducting the above imaging, the intensities at respective wavelengths can be obtained at each position. By using the temperature regression equation, the temperature can be determined at each position. The combustion state of garbage can be determined with high accuracy by monitoring both the temperature and the concentration of water as described above.

Hitherto, a large number of temperature sensors have been arranged in a combustor. However, the number of temperature sensors can be reduced by arranging the device of this embodiment on an upper portion or the top of a combustor.

Embodiments and Examples of the present invention have been described above. The embodiments and Examples of the present invention disclosed above are only illustrative, and the scope of the present invention is not limited to these embodiments of the invention. It is to be understood that the scope of the present invention is defined by the description of Claims and includes equivalence of the description in Claims and all modifications within the scope of Claims.

INDUSTRIAL APPLICABILITY

According to the semiconductor wafer or the light-receiving element, etc. of the present invention, the semiconductor element, etc. have a sensitivity in the near-infrared region, a dark current can be suppressed without cooling, a reduction in size and a higher sensitivity can be realized in the future, and the semiconductor element, etc. can be used for rapid testing of a biological object or the like.

The light-receiving element etc. of the present invention can have a satisfactory sensitivity in the near-infrared region in both cases of substrate illumination and epitaxial surface illumination when a hole is used as signal charge. Accordingly, high-quality products can be obtained in the fields of the industry, medical science, daily commodities, etc.

The invention claimed is:
1. A semiconductor wafer used for producing a light-receiving element or light-receiving element array that receives near-infrared light, the semiconductor wafer comprising:
   an InP substrate; and
   a multiquantum well structure (MQW) located on the InP substrate,
   wherein the multiquantum well structure has a laminated structure including pairs of an $In_xGa_{1-x}As$ ($0.38 \leq x \leq 0.68$, hereinafter represented by "InGaAs") layer and a $GaAs_{1-y}Sb_y$ ($0 \leq y \leq 0.73$) layer, and
   in the $GaAs_{1-y}Sb_y$ layer, the Sb content y in a portion on the InP substrate side is larger than the Sb content y in a portion on the opposite side.

2. The semiconductor wafer according to claim 1, wherein, in the $GaAs_{1-y}Sb_y$ layer, the Sb content y is decreased in a stepwise manner or in a constant manner from the InP substrate side to the opposite side.

3. The semiconductor wafer according to claim 1, wherein, in the $GaAs_{1-y}Sb_y$ layer, the Sb content y in the portion on the InP substrate side is in the range of 0.49 to 0.73, and the Sb content y in the portion on the opposite side is in the range of 0.25 to 0.49.

4. The semiconductor wafer according to claim 1, wherein, instead of the InGaAs layer, any one of InGaAsN, InGaAsNP, and InGaAsNSb forms a pair with the $GaAs_{1-y}Sb_y$ ($0.25 \leq y \leq 0.73$) layer to form the MQW.

5. An optical sensor device comprising the semiconductor wafer according to claim 1.

6. A light-receiving element comprising:
   an InP substrate;
   a light-receiving layer having a multiquantum well structure and located on the InP substrate;
   a contact layer located on the light-receiving layer;
   a p-type region extending from a surface of the contact layer to the light-receiving layer; and
   a p-side electrode that forms an ohmic contact with the p-type region,
   wherein the multiquantum well structure has a laminated structure including pairs of an $In_xGa_{1-x}As$ ($0.38 \leq x \leq 0.68$) layer and a $GaAs_{1-y}Sb_y$ ($0.25 \leq y \leq 0.73$) layer, and
   in the $GaAs_{1-y}Sb_y$ layer, the Sb content y in a portion on the InP substrate side is larger than the Sb content y in a portion on the opposite side.

7. The light-receiving element according to claim 6, wherein, in the $GaAs_{1-y}Sb_y$ layer, the Sb content y is decreased in a stepwise manner or in a constant manner from the InP substrate side to the opposite side.

8. The light-receiving element according to claim 6, wherein, in the $GaAs_{1-y}Sb_y$ layer, the Sb content y in the portion on the InP substrate side is in the range of 0.49 to 0.73, and the Sb content y in the portion on the opposite side is in the range of 0.25 to 0.49.

9. A light-receiving element array comprising a plurality of the light-receiving elements according to claim 6, and the InP substrate on which the light-receiving elements are arranged, wherein the p-type region is provided for each of the light-receiving elements, adjacent light-receiving elements are separated by a region that is not the p-type region, and the p-side electrode is arranged for each of the p-type regions.

10. A hybrid-type detection device comprising the light-receiving element array according to claim 9, and a read-out circuit formed in silicon, wherein a read-out electrode of the read-out circuit is conductively connected to each p-side electrode of the light-receiving element array.

11. The hybrid-type detection device according to claim 10, wherein light is incident from a rear surface of the InP substrate of the light-receiving element array.

12. An optical sensor device comprising the hybrid-type detection device according to claim 10.

13. An optical sensor device comprising the light-receiving element array according to claim 9.

14. The light-receiving element array according to claim 9, wherein the p-type region is a region formed by selectively diffusing Zn from a surface of the contact layer, or a region that is formed by being doped with a p-type impurity at the time of the growth of epitaxial layers including the contact layer and the MQW and that is surrounded by an n-type region formed by selective diffusion of an n-type impurity.

15. An optical sensor device comprising the light-receiving element according to claim 6.

16. A process for production of a semiconductor wafer used for producing a light-receiving element or light-receiving element array that receives near-infrared light, the process comprising:
  a step of growing a light-receiving layer having a multiquantum well structure on an InP substrate,
  wherein, in the step of growing the multiquantum well structure, an $In_xGa_{1-x}As$ ($0.38 \leq x \leq 0.68$) layer and a $GaAs_{1-y}Sb_y$ ($0.25 \leq y \leq 0.73$) layer are grown so as to form pairs, and
  the $GaAs_{1-y}Sb_y$ layer is grown so that the Sb content y in a portion on the InP substrate side is larger than the Sb content y in a portion on the opposite side.

* * * * *